(12) United States Patent
Nohsoh et al.

(10) Patent No.: US 6,670,680 B2
(45) Date of Patent: Dec. 30, 2003

(54) SEMICONDUCTOR DEVICE COMPRISING A DUAL GATE CMOS

(75) Inventors: Hiroyasu Nohsoh, Hyogo (JP); Shinya Soeda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 53 days.

(21) Appl. No.: 09/845,291

(22) Filed: May 1, 2001

(65) Prior Publication Data

US 2002/0093051 A1 Jul. 18, 2002

(30) Foreign Application Priority Data

Jan. 18, 2001 (JP) ........................................ 2001-009728

(51) Int. Cl.[7] ............................................... H01L 29/76
(52) U.S. Cl. ........................ 257/369; 257/371; 257/374; 257/501
(58) Field of Search ................................ 257/369, 338, 257/341, 371, 374, 501

(56) References Cited

U.S. PATENT DOCUMENTS

| 5,468,669 | A | * | 11/1995 | Lee et al. | ............ | 148/DIG. 20 |
| 5,550,079 | A | * | 8/1996 | Lin | ............ | 438/233 |
| 5,625,183 | A | * | 4/1997 | Kashitani et al. | ............ | 250/236 |
| 5,633,523 | A | * | 5/1997 | Kato | ............ | 257/369 |
| 5,882,965 | A | * | 3/1999 | Schwalke et al. | ............ | 438/227 |
| 6,030,861 | A | * | 2/2000 | Liu | ............ | 438/217 |
| 6,174,775 | B1 | * | 1/2001 | Liaw | ............ | 438/283 |
| 6,214,656 | B1 | * | 4/2001 | Liaw | ............ | 438/199 |
| 6,258,647 | B1 | * | 7/2001 | Lee et al. | ............ | 438/233 |
| 6,333,527 | B2 | * | 12/2001 | Kim | ............ | 257/288 |
| 6,413,803 | B1 | * | 7/2002 | Liaw | ............ | 438/157 |

FOREIGN PATENT DOCUMENTS

| JP | 6-104259 | | 4/1994 | |
| JP | 9-289257 | | 11/1997 | |
| JP | 09289257 A | * | 11/1997 | ........ H01L/21/8238 |
| JP | 10-050857 A | * | 2/1998 | ........ H01L/21/8238 |

OTHER PUBLICATIONS

S. Wolf, "Silicon Processing for the VLSI Era vol. 2: Process Integration," Lattice Press, 1990, pp. 45–58.*

* cited by examiner

*Primary Examiner*—George Eckert
*Assistant Examiner*—José R. Díaz
(74) *Attorney, Agent, or Firm*—McDermott, Will & Emery

(57) ABSTRACT

A dual gate type CMOS device according to the present invention includes a silicon substrate having a trench in the main surface and a gate electrode including a polysilicon film and a tungsten silicide film formed above the main surface via a gate insulating film. The polysilicon film has a first part into which p type impurities are doped, a second part into which n type impurities are doped and a connection part which connects the first part and the second part within the trench, and part of the tungsten silicide film located above the connection part is removed.

3 Claims, 16 Drawing Sheets

SEMICONDUCTOR DEVICE COMPRISING A DUAL GATE CMOS

BACKGROUND OF THE INVENTION

1. Field of the Invention

The present invention relates to a semiconductor device and the process for the same, in particular, to a dual gate type CMOS (complementary metal oxide semiconductor) device which has a gate including an n type silicon part doped with a large amount of phosphorous (P) and a p type silicon part doped with boron (B) as well as the process for the same.

2. Description of the Background Art

As for a gate electrode material of dual gate type CMOS devices, a polycide gate utilizing an n type polysilicon doped with a large amount of phosphorous (P) and a polycide gate utilizing a p type polysilicon doped with boron (B) are conventionally utilized. Then, the conductive type of the gate electrode of the nMOS transistor is $n^+$ type while the conductive type of the gate electrode of the pMOS transistor is $p^+$ type and the channel profiles of the nMOS transistor and the pMOS transistor are both surface type.

FIG. 32 shows an example of the structure of a conventional dual gate type CMOS device. As shown in FIG. 32, an n well 2 and a p well 3 are formed in a silicon substrate 1, a pMOS transistor is formed on the n well 2 and an nMOS transistor is formed on the p well 3.

An isolation insulating film 4 is selectively formed on the main surface of the silicon substrate 1 and a gate electrode 8 is formed so as to extend from the isolation insulating film 4 to the active regions. The gate electrode 8 is formed on the main surface of the silicon substrate 1 via a gate insulating film 5 and is formed of a polysilicon film 6 and a tungsten silicide film 7. An insulating film 9 is formed on the gate electrode 8 and a sidewall insulating film 10 is formed on the sidewalls of the gate electrode 8.

An interlayer insulating film which is not shown is formed so as to cover the insulating film 9 and the sidewall insulating film 10 and a wire which is not shown is formed on that interlayer insulating film so that the above wire and the gate electrode 8 are connected via a contact hole.

Since p type impurities such as boron (B) and n type impurities (dopant) such as phosphorous (P) are injected in the above gate electrode 8 as shown in FIG. 32, these impurities diffuse, mutually, through heat treatment at a high temperature (for example, 800° C. or more) after the formation of the gate electrode 8.

This phenomenon, significantly, occurs in the polycide gate structure as shown in FIG. 32 rather than in the polysilicon gate. This is because the diffusion phenomenon is considered to accelerate when a metal silicide film becomes a path mainly for impurities since the diffusion rate of the impurities in a metal silicide film is substantially larger than that in a polysilicon film.

In this manner, the impurities mutually diffuse within the gate electrode 8 and, thereby, the impurity concentrations are compensated both in the $n^+$ type region and in the $p^+$ type region of the gate electrode 8 so that the threshold voltage Vth fluctuates and a region, which is not the surface channel, is created.

In order to obviate this problem, there is a method for forming a pMOS transistor and an nMOS transistor separately. When this method is adopted, however, not only extra regions for providing contact holes for respective gates become necessary but also upper part wires corresponding to them if necessary. Therefore, the integrity is lowered.

SUMMARY OF THE INVENTION

The present invention is provided to solve the above described problem. The purpose of the present invention is to prevent mutual diffusion of impurities of different conductive types in a gate electrode having a part into which those impurities are introduced without lowering the integrity.

A semiconductor device according to the present invention includes a semiconductor substrate which has a trench in the main surface and a gate electrode which is formed above the main surface via a gate insulating film and which includes a silicon film and a metal-based conductive film. The silicon film has a first part doped with impurities of a first conductive type, a second part doped with impurities of a second conductive type and a connection part which connects the first part and the second part within the trench and a metal-based conductive film located on the connection part is removed. Here, the above silicon film includes a polysilicon film, an amorphous silicon film, and the like. In addition, a metal-based conductive film means a conductive film which includes metal so that the metal-based conductive film includes, for example, a metal film or a silicide film.

By providing a connection part within the trench as described above, the first and the second parts can be connected within the trench. In addition, by removing a metal-based conductive film located on the connection part, the metal-based conductive film can be divided above the connection part. Thereby, impurities can be prevented from mutually diffusing when passing through the metal-based conductive film.

It is preferable that a recess is provided in the above trench reaching to the connection part, penetrating through the metal-based conductive film, and that an insulating film be filled in into this recess. In this manner, an insulating film is filled in between the metal-based conductive film and, thereby, the mutual diffusion of the impurities in the gate electrode can be effectively prevented.

In addition, the trench is formed in an element isolation region and the above connection part is formed on the surface with in the trench via a base insulating film wherein the thickness of the base insulating film is larger than the thickness of the gate insulating film.

By making the thickness of the base insulating film larger than the thickness of the gate insulating film in this manner, a leak current can be prevented in the element isolation region.

The minimum width of the aperture part of the trench surrounded by the above base insulating film is two times, or less, as large as the thickness of the silicon film. Thereby, the aperture part of the trench can be filled with the silicon film and the unevenness in the silicon film surface above the trench can be reduced.

A process for a semiconductor device according to the present invention includes, in one aspect, the following respective steps. A trench isolation region is formed in the main surface of a semiconductor substrate. On the main surface, a silicon film, which has a first part doped with impurities of a first conductive type and a second part doped with impurities of a second conductive type, a metal-based conductive film and a first insulating film are formed. By patterning the first insulating film, the metal-based conductive film and the silicon film, a gate electrode is formed. A second insulating film is formed so as to cover the first insulating film. A first mask film is formed on the second insulating film. The second insulating film is etched by using the first mask film so as to form a first sidewall insulating film on the sidewalls of the gate electrode and so as to selectively expose the surface of the first insulating film. A second mask film is formed on the surface of the first insulating film so as to expose a part of the surface of the first insulating film located above the trench isolation region and the second insulating film. The second insulating film is etched by using the second mask film so as to form a second sidewall insulating film on the sidewalls of the gate electrode and the first insulating film located above the trench isolation region and the metal-based conductive film are etched so as to form a recess which reaches to the silicon film.

Since a part of the surface of the first insulating film located above the trench isolation region is exposed at the time when the second insulating film is etched by using the second mask film, the first insulating film and the metal-based conductive film located beneath can be etched at the time when the second insulating film is etched. Thereby, a recess which reaches to the silicon film can be formed so that the metal-based conductive film can be divided above the trench isolation region.

It is preferable that the step of forming a pair of first impurity regions (high concentration impurity regions) which become the source and drain of the first MOS transistor by injecting impurities of the first conductive type into the main surface of the semiconductor substrate by using, as a mask, the above first mask film, the first sidewall insulating film and the first part of the gate electrode as well as the step of forming a pair of second impurity regions (high concentration impurity regions) which become the source and drain of the second MOS transistor by injecting impurities of the second conductive type into the main surface of the semiconductor substrate by using, as a mask, the second mask film, the second sidewall insulating film and the second part of the gate electrode are provided.

In this manner, the source and drain of each MOS transistor can be formed by injecting predetermined impurities into the main surface of the semiconductor substrate by using the above described first and second mask films, and the like, and therefore, it is not necessary to add a new mask for the formation of a recess according to the present invention.

A process for a semiconductor device according to another aspect of the invention includes the following respective steps. A trench for element isolation is formed in the main surface of a semiconductor substrate. A base insulating film is formed on the surface within the trench. A silicon film which has a first part doped with impurities of the first conductive type and a second part doped with impurities of the second conductive type is formed on the main surface and a connection part between the first and second parts in the silicon film is formed on the base insulating film within the trench. A metal-based conductive film and an insulating film are formed on the silicon film. A mask film, which has an aperture above the trench, is formed on the insulating film. By patterning the insulating film, the metal-based conductive film and the silicon film using the mask film, a gate electrode is formed and a recess is formed so as to reach to the connection part above the trench.

Since a connection part is formed within the trench as described above, the thickness of that connection part can be made larger than that of the silicon film 6 located on the main surface as shown in, for example, FIG. 29. Thereby, at the time when the insulating film, the metal-based conductive film and the silicon film are patterned, the etching can be stopped at the above connection part so that the metal-based conductive film can be divided above the connection part.

The step of forming the above base insulating film includes the step of forming a buried insulating film which is filled in into the trench, the step of forming a first aperture part which penetrates through the buried insulating film so as to reach to the bottom surface of the trench and the step of forming a bottom part insulating film which covers the bottom surface of the trench which has been exposed so as to form a second aperture part above the trench.

Thereby, the second aperture part can be formed in the base insulating film so that the above described connection part can be formed within the trench by filling in this second aperture part with a silicon film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention are described referring to FIGS. 1 to 31.

First Embodiment

Figure 1:
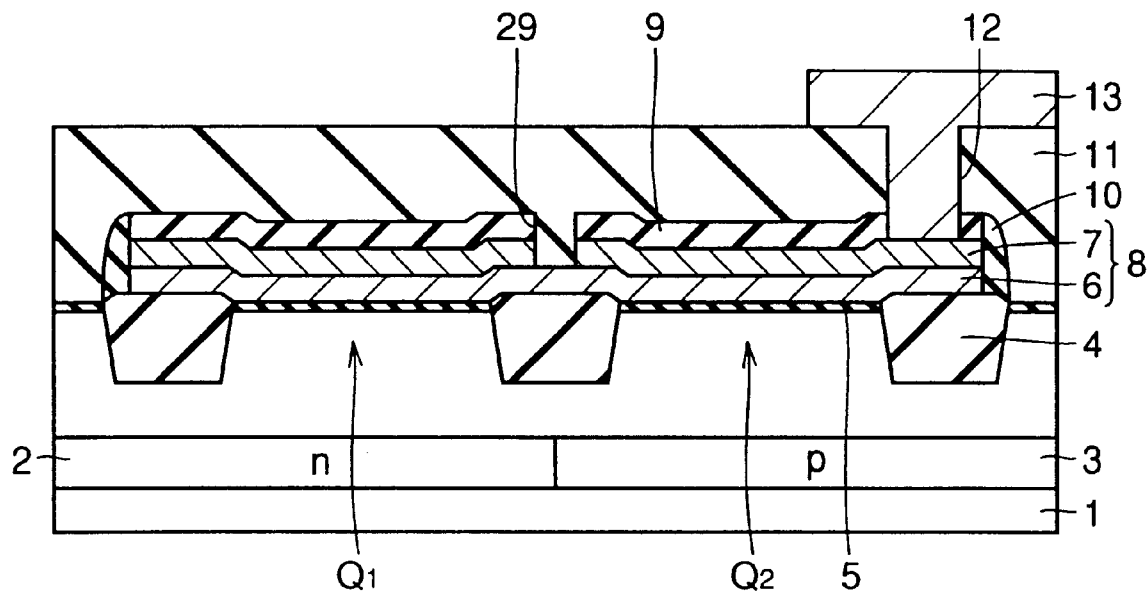
FIG. 1 is a cross section view of a semiconductor device according to a first embodiment of the present invention.
Figure 2:
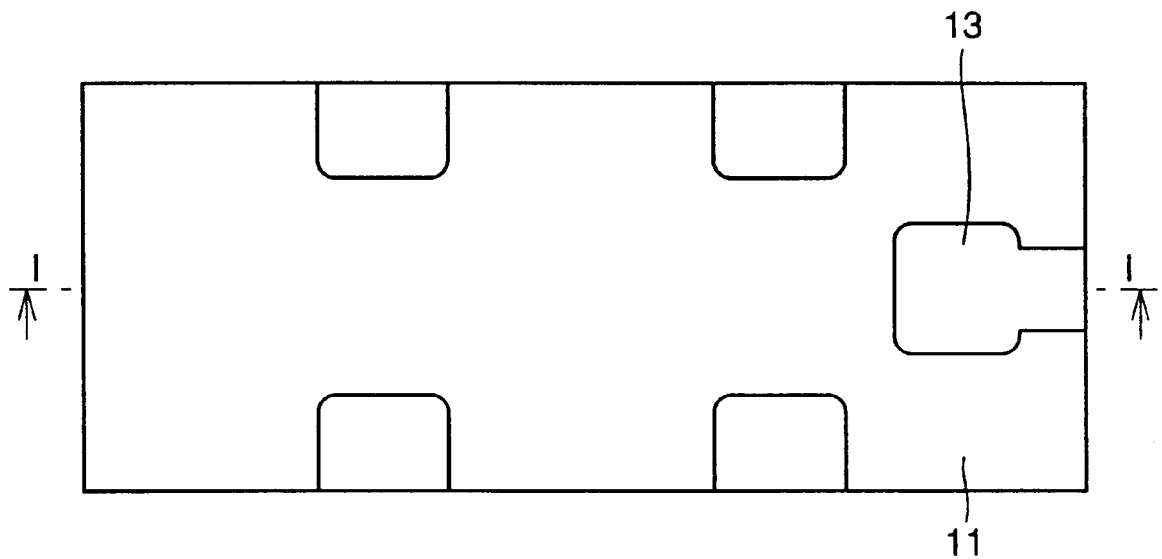
FIG. 2 is a plan view of the semiconductor device as shown in FIG. 1.

FIG. 1 is a cross section view of a dual gate type CMOS device according to the first embodiment and FIG. 2 is a plan view of the dual gate type CMOS device as shown in FIG. 1. Here, FIG. 1 is a view showing the cross section along line I—I in FIG. 2.

As shown in FIG. 1, a dual gate type CMOS device (semiconductor device) has a pMOS transistor Q1 and an nMOS transistor Q2 formed on a silicon substrate 1.

An n well 2 and a p well 3 are formed within the silicon substrate 1 and the pMOS transistor Q1 is formed on the n well 2 while the nMOS transistor Q2 is formed on the p well 3.

A trench for element isolation is formed in the main surface of the silicon substrate 1 and an isolation insulating film 4 is formed within this trench. A gate electrode 8 is formed above the main surface of the silicon substrate 1 via a gate insulating film 5.

The gate electrode 8 extends from active regions to the isolation insulating film 4 and has a part which becomes the gate of the pMOS transistor Q1 and a part which becomes the gate of the nMOS transistor Q2. In addition, the gate electrode 8 has a layered structure of a polysilicon film (or amorphous silicon film) 6 and a tungsten silicide film (metal-based conductive film) 7.

The polysilicon film 6 includes, as shown in FIG. 1, a first part which is doped with p type impurities such as boron (B) so as to become the gate of the pMOS transistor Q1 and a second part which is doped with n type impurities such as phosphorous (P) so as to become the gate of the nMOS transistor Q2.

The tungsten silicide film 7 is divided above the trench located in the middle. Thereby, the impurities doped in the polysilicon film 6 can be prevented from mutually diffusing when passing through the tungsten silicide film 7.

An insulating film 9 made of a silicon oxide film, or the like, is formed on the gate electrode 8 and a sidewall insulating film 10 made of a silicon oxide film, or the like, is formed on the sidewalls of the gate electrode 8.

An interlayer insulating film 11 is formed of a silicon oxide film, or the like, so as to cover the insulating film 9 and the sidewall insulating film 10 and a contact hole 12 is created in this interlayer insulating film 11. Then, a wiring layer 13 is formed so as to extend from the contact hole 12 to the interlayer insulating film 11.

Next, a process for the dual gate type CMOS device according to the first embodiment as shown in FIGS. 1 and 2 is described referring to FIGS. 3 to 24. FIGS. 3 to 24 are cross section views or plan views showing respective steps in the process for the dual gate type CMOS device according to the first embodiment.

Figure 3:
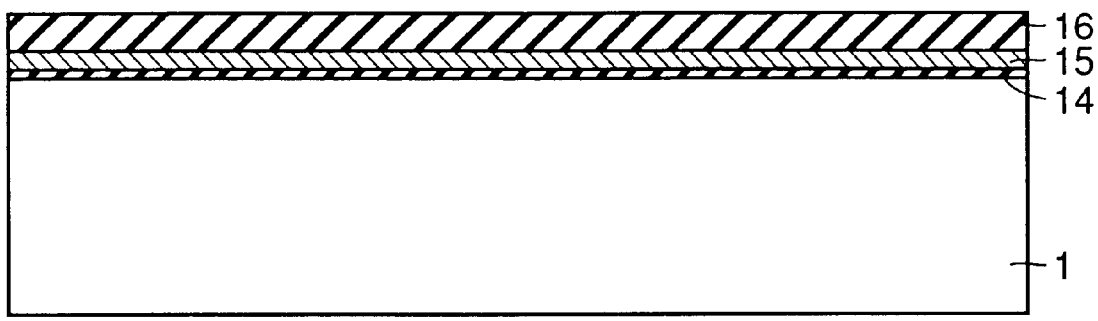
FIGS. 3 to 13 are cross section views showing the first to the eleventh steps of a process for the semiconductor device as shown in FIG. 1.

As shown in FIG. 3, a silicon oxide film 14 of the thickness of approximately 20 nm is formed through a thermal oxidation method, or the like, on the main surface of a silicon substrate 1 and a polysilicon film 15 of the thickness of approximately 50 nm and a silicon nitride film 16 of the thickness of approximately 170 nm are formed, by using a CVD (chemical vapor deposition) method, on the above silicon oxide film 14.

Figure 4:
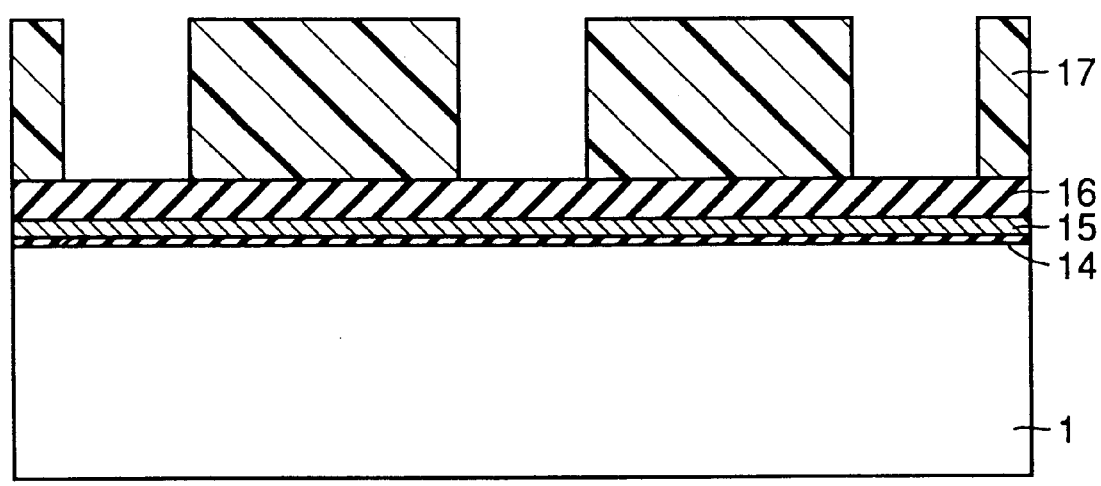
Figure 5:
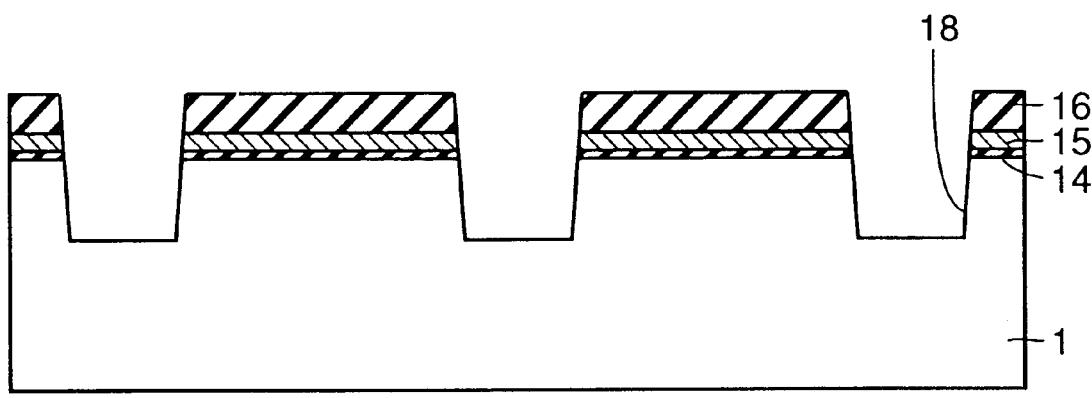

Next, a photoresist 17 is applied to the silicon nitride film 16 and the photoresist 17 is patterned into a predetermined shape by carrying out a photomechanical processing as shown in FIG. 4. By carrying out dry etching using this photoresist 17 as a mask, a trench 18 is formed as shown in FIG. 5.

Figure 6:
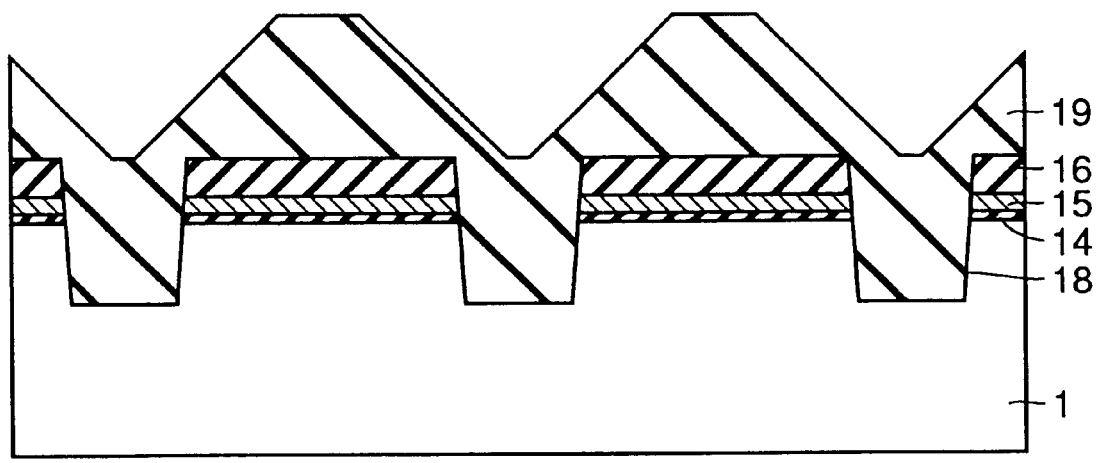

Next, the surface within the trench 18 is oxidized by approximately 30 nm and a silicon oxide film 19 of the thickness of approximately 500 nm is deposited through a CVD method. Thereby, the silicon oxide film 19 is filled in into the trench 18 as shown in FIG. 6.

Figure 7:
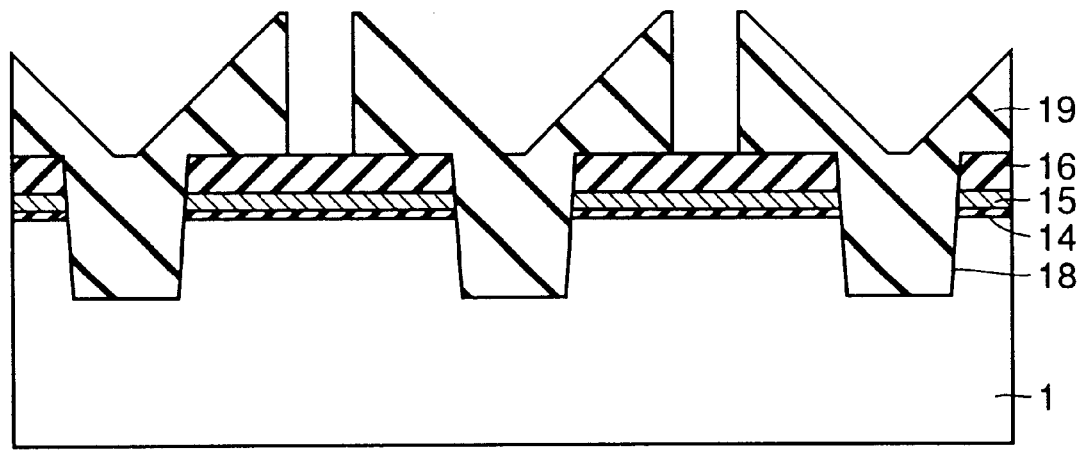

Next, photomechanical processing and dry etching are carried out so that, as shown in FIG. 7, the silicon oxide film 19 above the active regions are partially etched. After that, protruding parts in the silicon oxide film 19 are polished and flattened through a CMP (chemical mechanical polishing) method, or the like, and the polysilicon film 15 and the silicon nitride film 16 are removed through wet etching. Thereby, an isolation insulating film 4 which creates isolations between elements can be formed.

Figure 8:
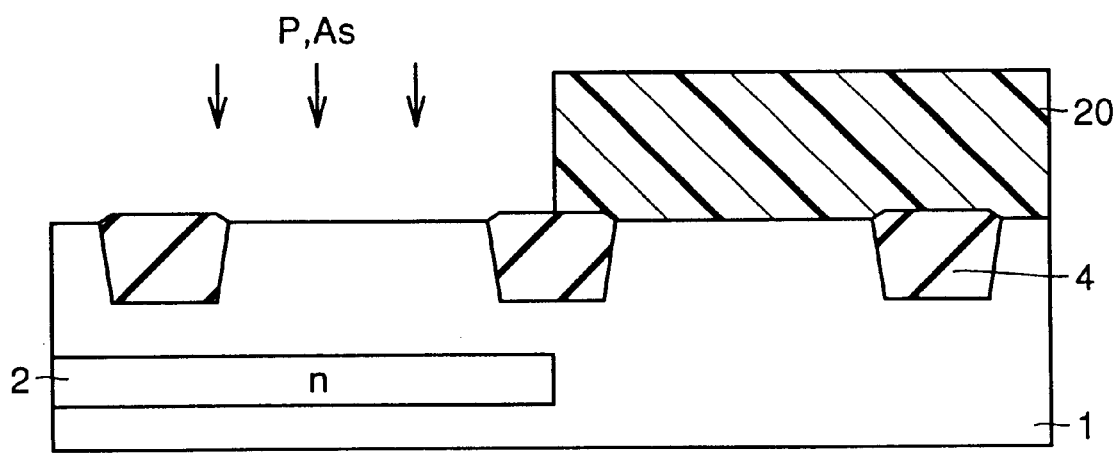

Next, a photoresist 20, which has an aperture part above the formation region of the pMOS transistor Q1, is formed and n type impurities such as P or As are injected into the silicon substrate 1 by using this photoresist 20 as a mask. Thereby, an n well 2 is formed as shown in FIG. 8.

Figure 9:
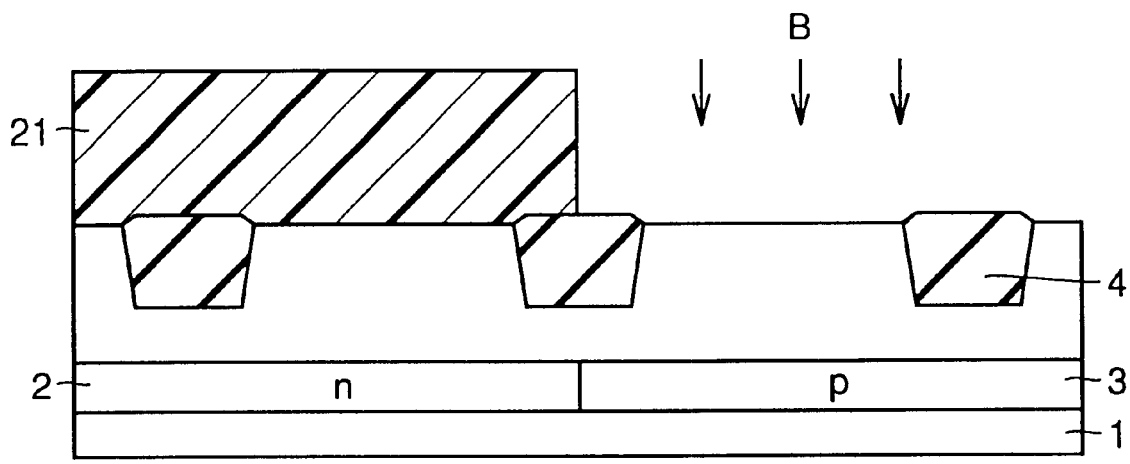

Next, a photoresist 21 which has an aperture part above the formation region of the nMOS transistor Q2 is formed and p type impurities such as B are injected into the silicon substrate 1 by using this photoresist 21 as a mask. Thereby, as shown in FIG. 9, a p well 3 is formed.

Next, by carrying out thermal oxidation, a gate insulating film 5 of approximately 8 nm is formed and a polysilicon film (or amorphous silicon film) 6 of the thickness of approximately 80 nm is deposited, through a CVD method, on the above gate insulating film 5.

Figure 10:
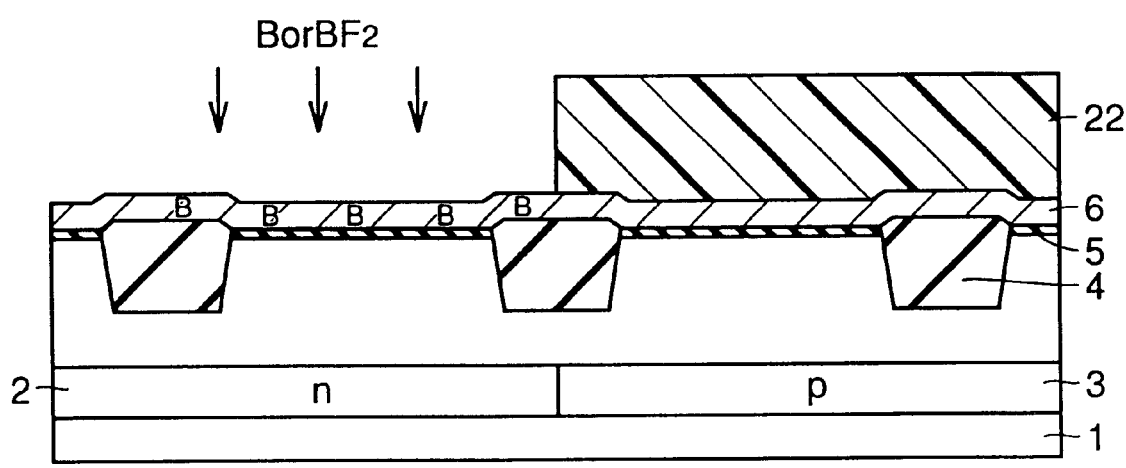

As shown in FIG. 10, a photoresist 22, which has an aperture part above the formation region of the pMOS transistor Q1, is formed on the polysilicon film 6 and, by using this photo resist 22 as a mask, p type impurities such as B or $BF_2$ are injected into the polysilicon film 6. Thereby, the above described first part is formed in the polysilicon film 2.

Figure 11:
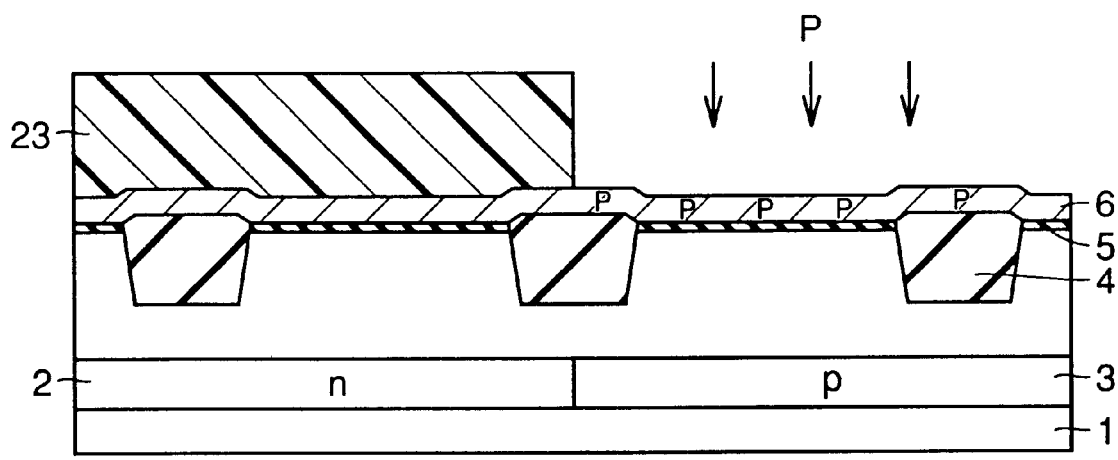

Next, as shown in FIG. 11, a photoresist 23 which has an aperture part above the formation region of the nMOS transistor Q2 is formed and, by using this photoresist 23 as a mask, n type impurities such as P are injected into the polysilicon film 6. The injection amount is $4 \times 10^{15}$ (/cm$^2$). Thereby, the above described second part is formed in the polysilicon film 6.

Figure 12:
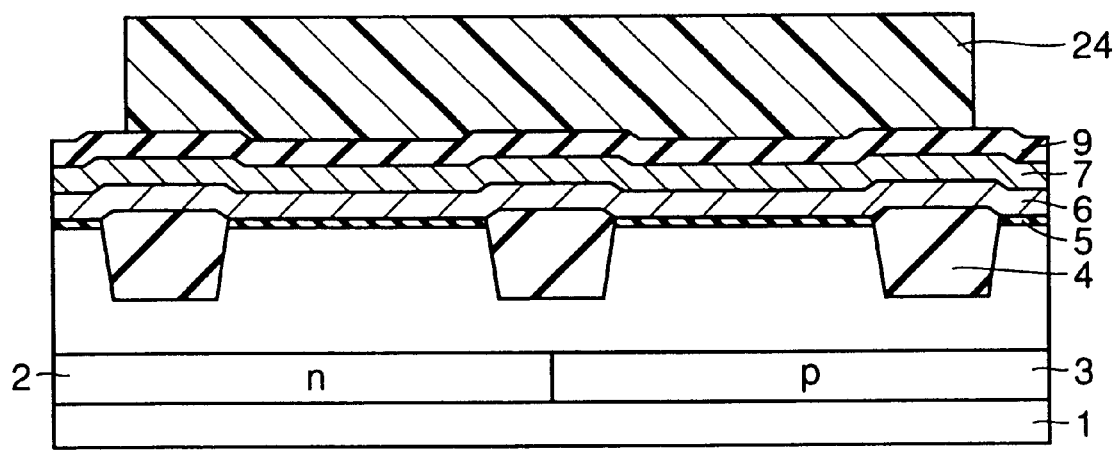

As shown in FIG. 12, a tungsten silicide film 7 of the thickness of approximately 80 nm is formed, through a CVD method, on the polysilicon film 6. Here, another high melting point metal silicide film such as $TiSi_2$ may be utilized.

An insulating film 9 made of a silicon oxide film (TEOS: tetra etyle ortho silicate), or the like, of the thickness of approximately 100 nm is deposited, through a CVD method, on the tungsten silicide film 7. Here, as the insulating film 9, a layer film made of silicon oxide film and silicon nitride film, or silicon nitride film or the like may be utilized.

As shown in FIG. 12, a photoresist 24 in a predetermined shape is formed on the insulating film 9 and the insulating film 9 is etched by using this photoresist 24 as a mask. After that, the photoresist 24 is removed and the tungsten silicide film 7 and the polysilicon film 6 are etched by using the insulating film 9 as a mask.

Figure 13:
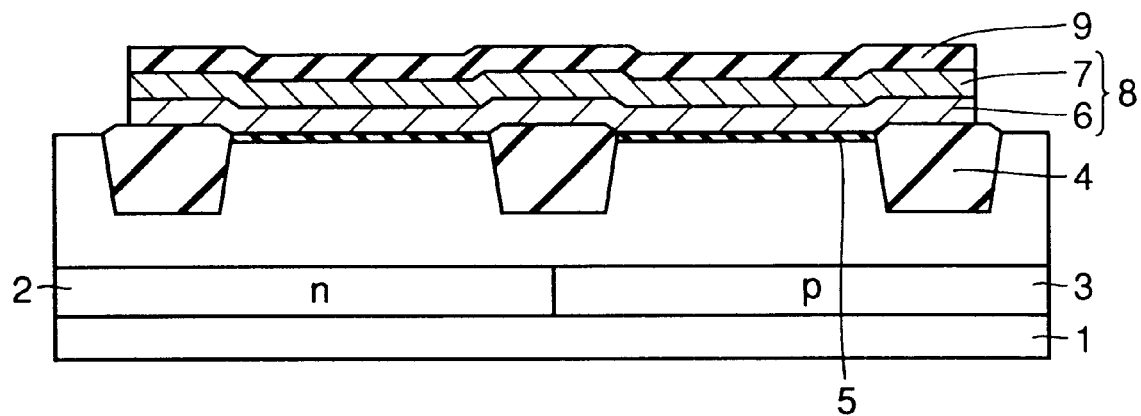
Figure 14:
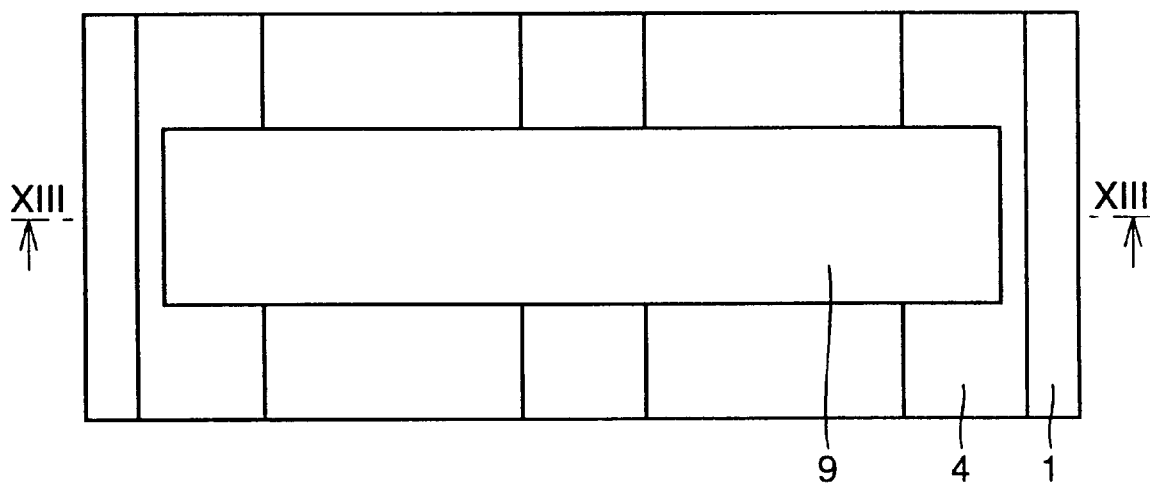
FIG. 14 is a plan view of the semiconductor device as shown in FIG. 13.

Thereby, a gate electrode 8 is formed as shown in FIG. 13. A plan view of the device after the formation of the gate electrode 8 is shown in FIG. 14. The cross section structure along line XIII—XIII in FIG. 14 is shown in FIG. 13.

Figure 15:
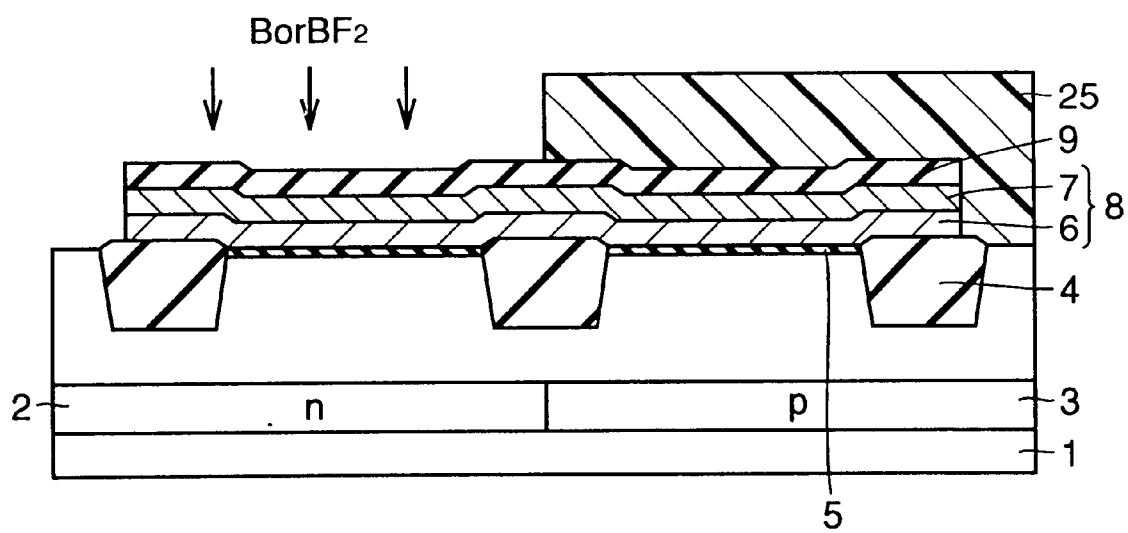
FIG. 15 is a cross section view showing the twelfth step of the process for the semiconductor device as shown in FIG. 1.
Figure 16:
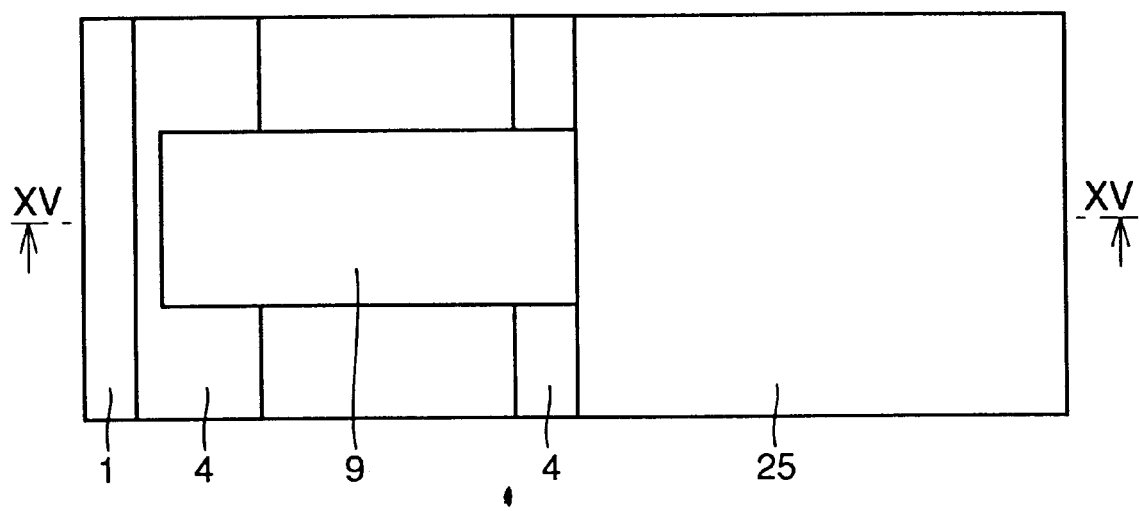
FIG. 16 is a plan view of the semiconductor device as shown in FIG. 15.

Next, as shown in FIGS. 15 and 16, a photoresist 25, which has an aperture part above the formation region of the pMOS transistor Q1, is formed on the insulating film 9 and, by using this photoresist 25 as a mask, p type impurities such as B or $BF_2$ are injected into the main surface of the silicon substrate 1.

Thereby, low concentration impurity regions for the source and drain of the pMOS transistor Q1 are formed, on both sides of the gate electrode 8, located beneath the insulating film 9 shown in FIG. 16. Here, the cross sectional structure along line XV—XV in FIG. 16 is shown in FIG. 15.

Figure 17:
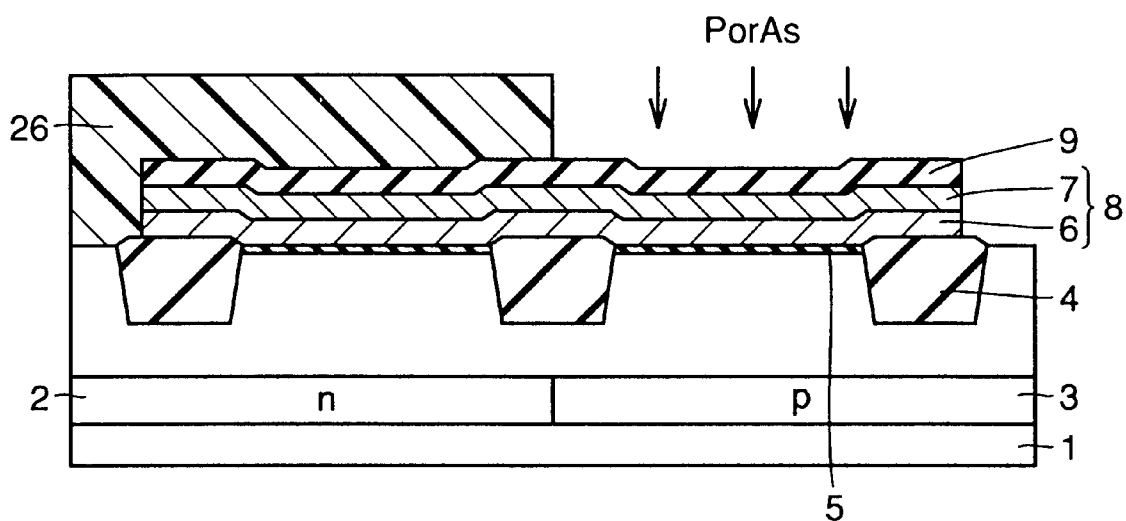
FIG. 17 is a cross section view showing the thirteenth step of the process for the semiconductor device as shown in FIG. 1.
Figure 18:
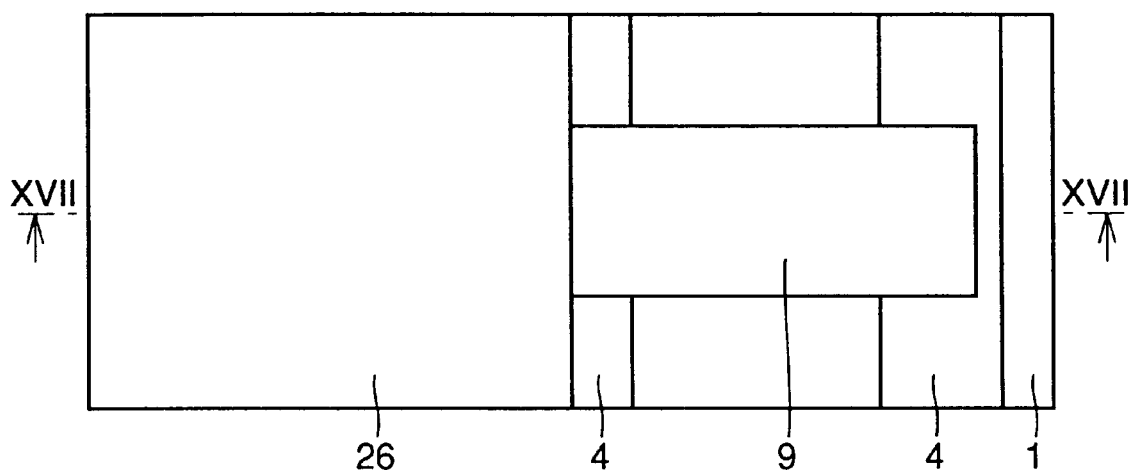
FIG. 18 is a plan view of the semiconductor device as shown in FIG. 17.

Next, as shown in FIGS. 17 and 18, a photoresist 26, which has an aperture part above the formation region of the nMOS transistor Q2, is formed and, by using this photoresist 26 as a mask, n type impurities such as P or As are injected into the main surface of the silicon substrate 1.

Thereby, low concentration impurity regions for the source and drain of the nMOS transistor Q2 are formed, on both sides of the gate electrode 8, located beneath the insulating film 9 shown in FIG. 18. Here, the cross section structure along line XVII—XVII in FIG. 18 is shown in FIG. 17.

Figure 19:
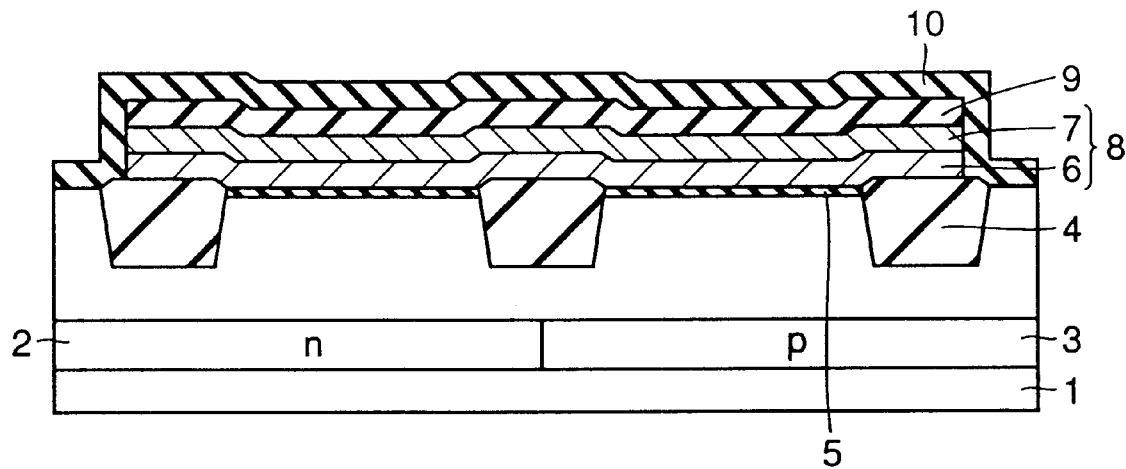
FIGS. 19 and 20 are cross section views showing the fourteenth and fifteenth steps of the process for the semiconductor device as shown in FIG. 1.

Next, as shown in FIG. 19, an insulating film 10 made of a silicon oxide film (TEOS), or the like, of the thickness of approximately 40 nm is deposited through a CVD method. Here, a silicon nitride film may be formed in place of the silicon oxide film.

Figure 20:
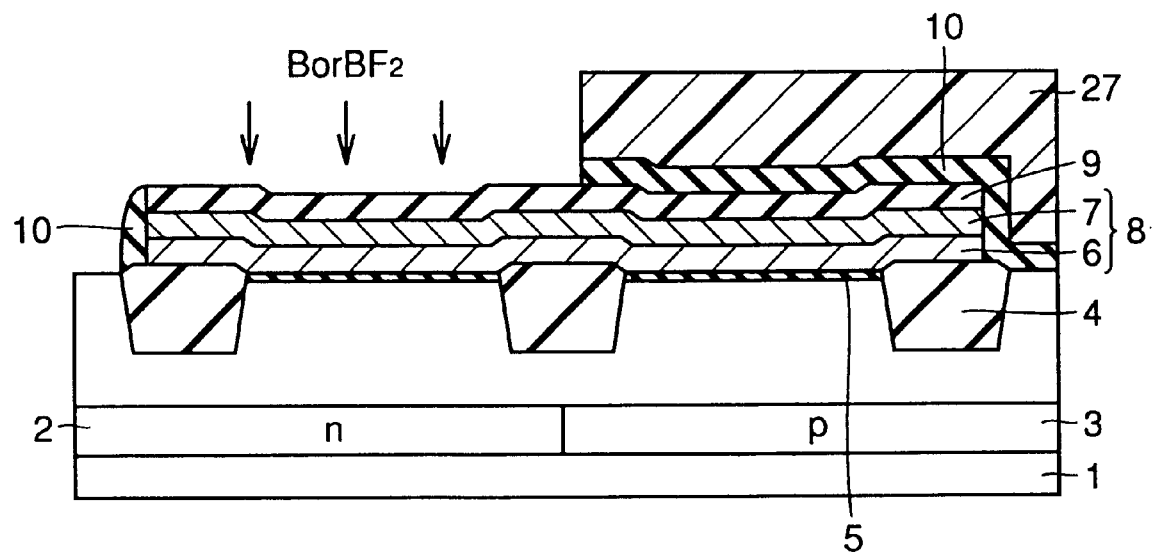
Figure 21:
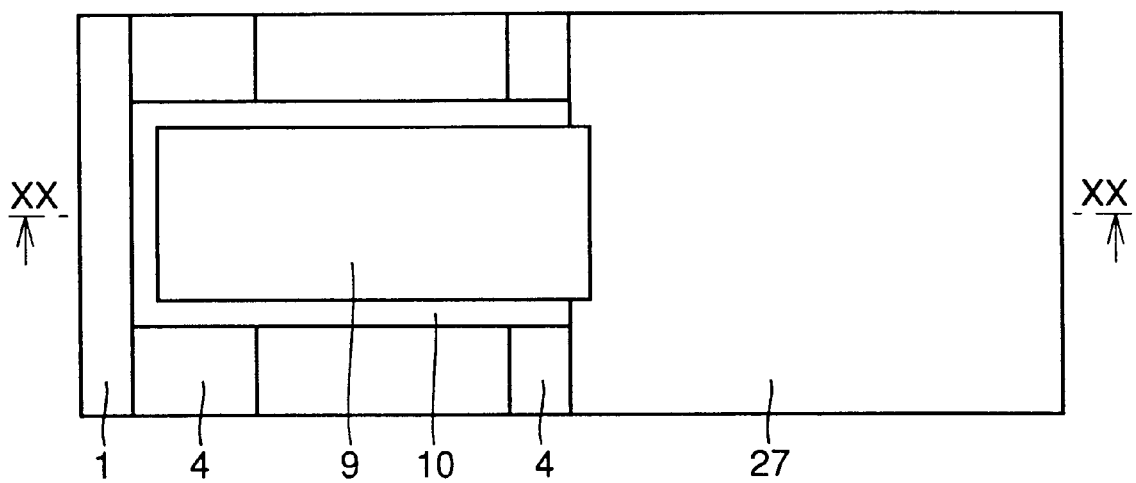
FIG. 21 is a plan view of the semiconductor device as shown in FIG. 20.

As shown in FIG. 20, a photoresist 27, which has an aperture part above the formation region of the pMOS transistor Q1, is formed on the insulating film 10. This photoresist 27 has a recess in the middle part of the edge on the side of the pMOS transistor Q1 as shown in FIG. 21.

The insulating film 10 is etched back by using the above photoresist 27 as a mask. Thereby, as shown in FIGS. 20 and 21, a sidewall insulating film 10 is formed on the sidewalls of the gate electrode 8 and the surface of the insulating film 9 is selectively exposed.

After that, by using, as a mask, the photoresist 27, the insulating film 9 and the sidewall insulating film 10, p type impurities such as B or $BF_2$ are injected into the main surface of the silicon substrate 1. The injection amount in approximately $4\times10^{15}$ (/cm$^2$). Thereby, high concentration impurity regions for the source and drain of the pMOS transistor Q1 are formed. Here, the cross section structure along line XX—XX in FIG. 21 is shown in FIG. 20.

Figure 22:
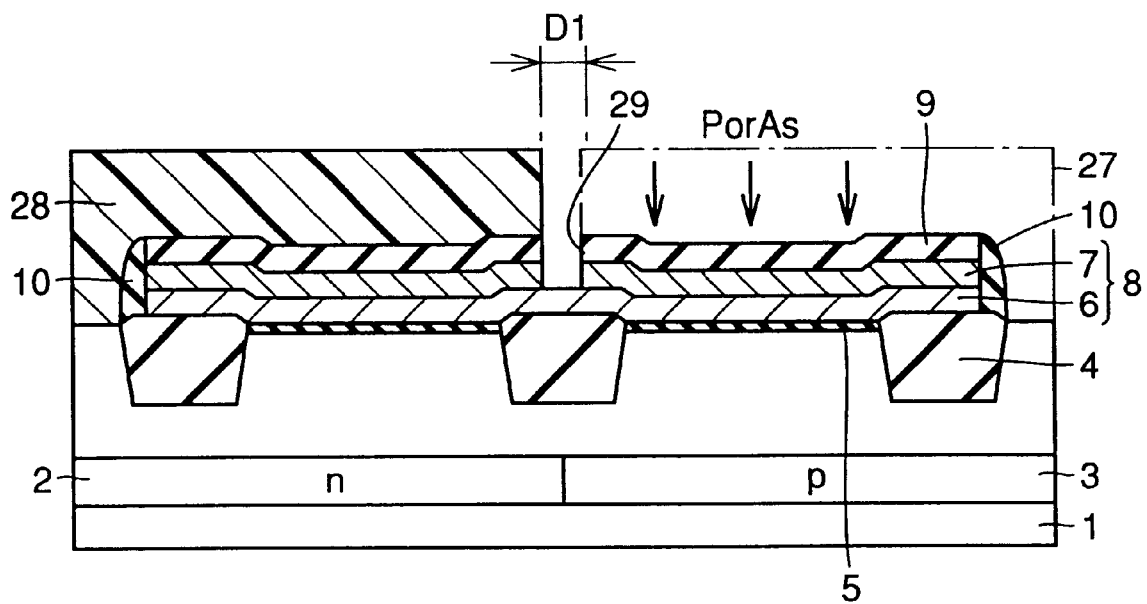
FIG. 22 is a cross section view showing the sixteenth step of the process for the semiconductor device as shown in FIG. 1.
Figure 23:
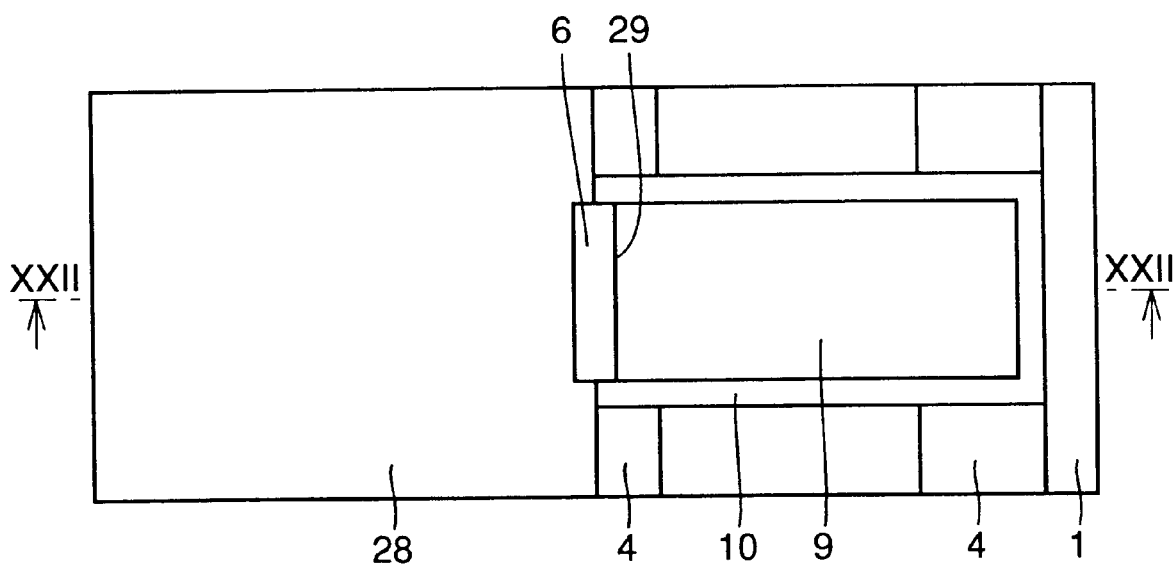
FIG. 23 is a plan view of the semiconductor device as shown in FIG. 22.

Next, as shown in FIGS. 22 and 23, a photoresist 28 which has an aperture part above the formation region of the nMOS transistor Q2 is formed on the insulating film 9 and the insulting film 10 is etched back by using this photoresist 28 as a mask. Here, the cross section view along line XXII—XXII in FIG. 23 corresponds to FIG. 22.

The photoresist 28 exposes the insulating film 10 located above the formation region of the nMOS transistor Q2 and has a recess in the middle part of the edge on the nMOS transistor Q2 side as shown in FIG. 23.

Accordingly, the aperture part above the formation region of the pMOS transistor Q1, as shown in FIG. 20, and the aperture part above the formation region of the nMOS transistor Q2 shown in FIG. 22, overlap above the central trench in FIG. 22 so that a region which is not covered by either photoresist 27 or 28 at the time of the etching back of the insulating film 10 exists.

More concretely, a part of the surface of the insulating film 9 located above the central trench in FIG. 22 becomes the region which is not covered by either photoresist 27 or 28. Therefore, at the time of the etching back of the insulating film 10, the insulating film 9, located above the central trench, and the tungsten silicide film 7, located beneath, can be etched so that a recess 29 can be formed above the central trench so as to reach to the polysilicon film 6, as shown in FIG. 22.

As shown in FIG. 22, the gap D1 between the photoresists 27 and 28 (gap between the bottoms of recesses provided in the middle part of the edge of the photoresists 27 and 28) is, for example, 1 to 3 $\mu$m. This gap D1 needs to be two times or more of the position precision error $\Delta$d in the photochemical processing. This is in order to prevent the gap D1 from becoming zero, or less, during the two photochemical processes for the pMOS transistor Q1 and for the nMOS transistor Q2.

By properly selecting the gap D1 as described above, a recess 29 can surely be formed so as to reach to the polysilicon film 6 above the central trench as shown in FIG. 22 and the tungsten silicide film 7 which is a path for impurities (dopant) can be divided above the central trench. That is to say, the tungsten silicide film 7 can be divided at the border between the pMOS transistor Q1 and the nMOS transistor Q2.

Thereby, the p type impurities and the n type impurities can be prevented from mutually diffusing when passing through the tungsten silicide film 7 and the fluctuation of the threshold voltage Vth of the pMOS transistor Q1 or the nMOS transistor Q2 as well as the formation of a region which is not the surface channel can be prevented.

Next, as shown in FIG. 22, by using, as a mask, the photoresist 28, the insulating film 9 and the sidewall insulating film 10, n type impurities such as P or As are injected into the main surface of the silicon substrate 1. The injection amount is approximately $4\times10^{15}$ (/cm$^2$). Thereby, high concentration impurity regions of the source and drain of the nMOS transistor Q2 are formed.

Only by devising the shape of the photoresists (mask film) 27, 28 for forming the source and drain of each MOS transistor in this manner, can the tungsten silicide film 7 be divided and, therefore, it is not necessary to add a new mask.

After forming the source and drain of each MOS transistor through the above described method, heat processing is carried out at a temperature of approximately 820° C. in order to activate the impurities injected into the source and drain.

In the case of the formation of a salicide (self aligned silicide) structure, a silicon oxide film (TEOS) of the thickness of approximately 50 nm is deposited through a CVD method and a photoresist is formed so as to expose the part where the salicide structure is formed. By using this photoresist as a mask, dry etching or wet etching is carried out so as to selectively remove the silicon oxide film.

Next, a high melting point metal film such as Co is formed by a sputtering method, to which heat processing is applied. Thereby, a salicide structure can be formed. Here, a saliside structure may be formed on the surface of the polysilicon film 6 which is exposed in FIG. 23.

Figure 24:
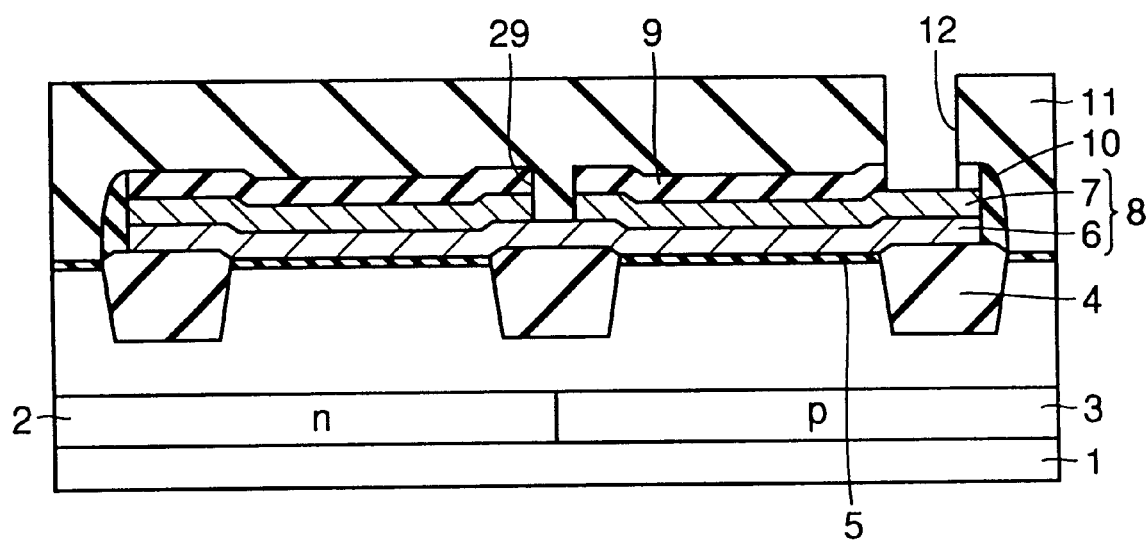
FIG. 24 is a cross section view showing the seventeenth step of the process for the semiconductor device as shown in FIG. 1.

Next, an interlayer insulating film 11 made of a silicon oxide film (BPSG: boro phospho silicate glass) doped with B and P, or the like, of the thickness of approximately 700 nm is deposited through a CVD method. At this time, the silicon oxide film is filled in into the recess 29. After that, photomechanical processing and dry etching are carried out so that a contact hole 12 is created in the interlayer insulating film 11 as shown in FIG. 24.

Next, after depositing metal such as tungsten through a CVD method, photomechanical processing and dry etching are carried out and, thereby, a wiring layer 13 is formed so as to extend from the contact hole 12 to the interlayer insulating film 11.

Through the above described steps, the dual gate type CMOS device according to the embodiment as shown in FIGS. 1 and 2 can be formed.

Second Embodiment

Figure 25:
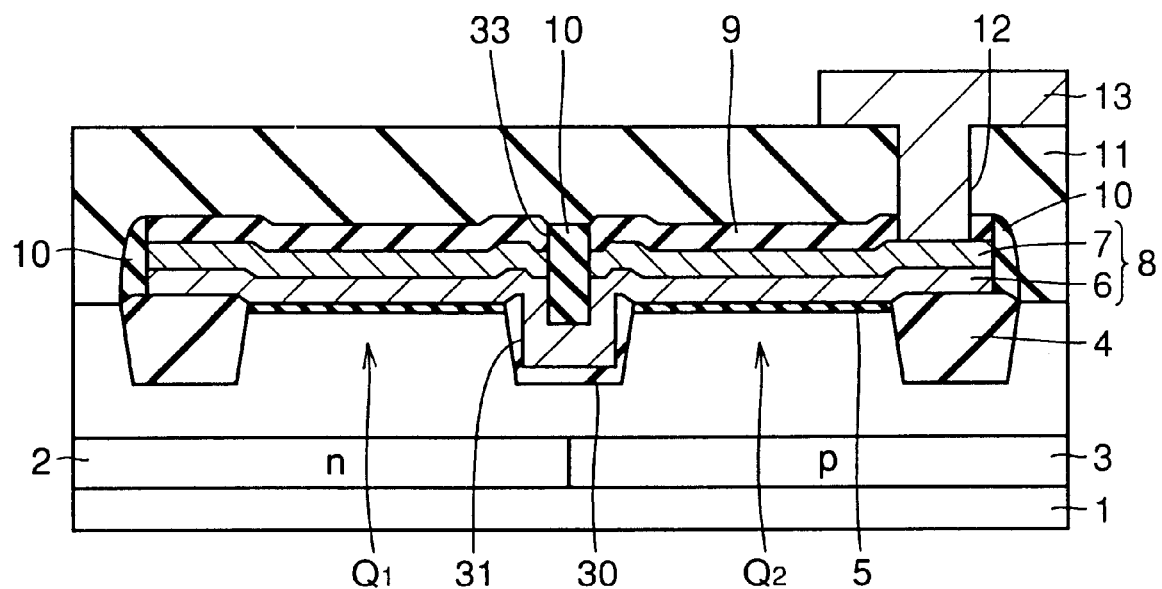
FIG. 25 is a cross section view of a semiconductor device according to a second embodiment of the present invention.

Next, the second embodiment according to the present invention is described referring to FIGS. 25 to 31. FIG. 25 is a cross section view of a dual gate type CMOS device according to the present embodiment.

As shown in FIG. 25, in the dual gate type CMOS device according to the present embodiment, a polysilicon film 6 has a first part that becomes the gate of a pMOS transistor Q1 by being doped with p type impurities such as boron (B), a second part that becomes the gate of an nMOS transistor Q2 by being doped with n type impurities such as phosphorous (P) and a connection part which extends within the trench for element isolation located in the middle and which connects the first part and the second part, wherein part of a tungsten silicide film 7 located above connection part is removed.

By providing the connection part within the trench as described above, the first and the second parts can be connected within the trench. That is to say, the pMOS transistor Q1 and the nMOS transistor Q2 are connected through this connection part.

In addition, by removing part of the tungsten silicide film 7 located above the connection part, the tungsten silicide film 7 can be divided above the connection part. Thereby, the impurities which have been doped into the first and the second parts can be prevented from mutually diffusing when passing through the tungsten silicide film 7.

As shown in FIG. 25, a recess 33 is provided above the central trench reaching to the connection part, penetrating through the insulating film 9 and the tungsten silicide film 7, and an insulating film 10 is filled in into this recess 33.

In addition, the above connection part is formed on the surface within the central trench via a base insulating film 30. The thickness of this base insulating film 30 is approximately 100 nm, which is larger than the thickness of the gate insulating film 5. Thereby, a leak current in the element isolation region can be prevented.

Here, the same components as in the device shown in FIG. 1 are denoted by the same numerals, of which the descriptions are omitted so as to avoid repetition.

Next, a process for a dual gate type CMOS device according to the present embodiment is described.

Figure 26:
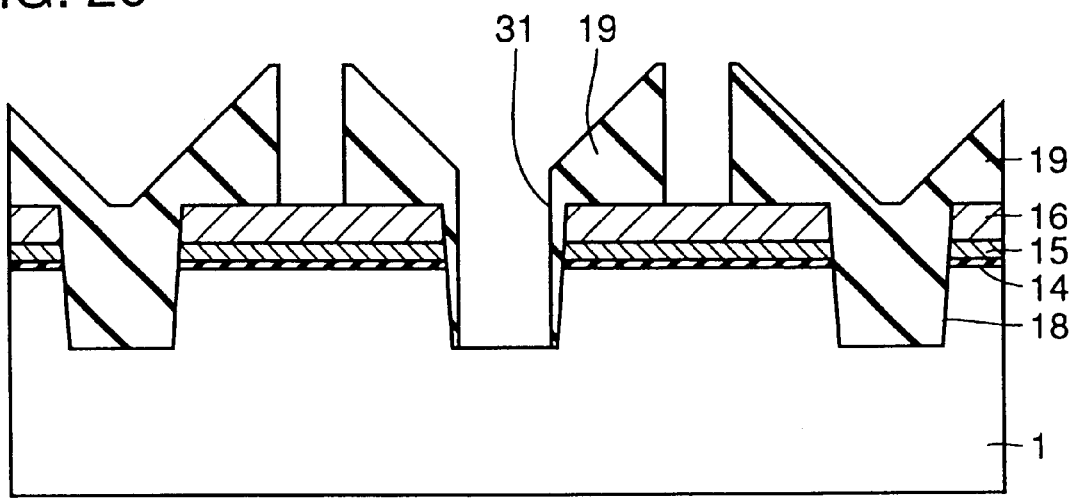
FIG. 26 is a cross section view showing the first step of a process for the semiconductor device as shown in FIG. 25.

The silicon oxide film 19 is formed through the same steps as in the case of the first embodiment and, then, the silicon oxide film 19 above the active regions is partially etched by carrying out a photomechanical process and dry etching. At this time, part of the silicon oxide film 19 located within the central trench is also etched so as to create an aperture part 31 which exposes the bottom of the central trench as shown in FIG. 26.

Figure 27:
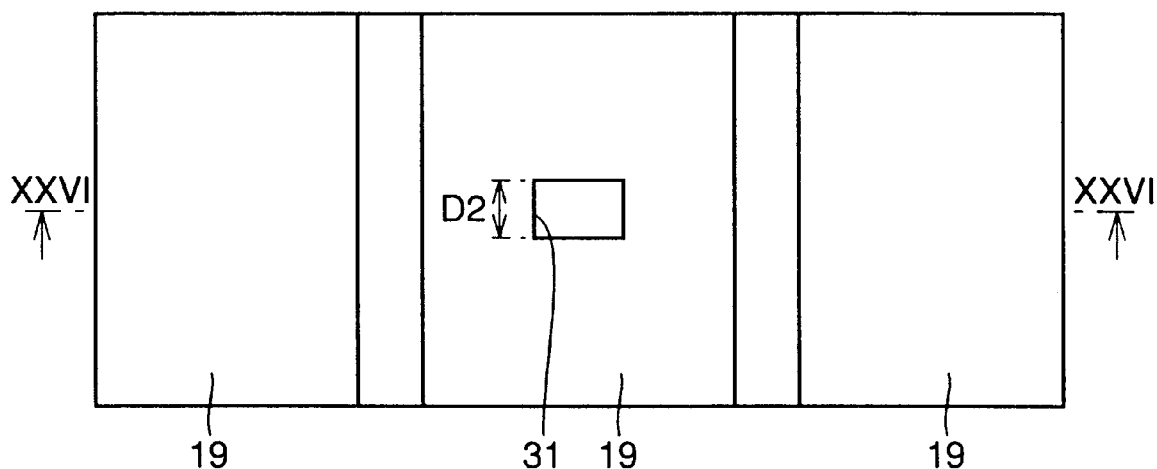
FIG. 27 is a plan view of the semiconductor device as shown in FIG. 26.

FIG. 27 shows a plan view of a device in the present step. The cross section along line XXVI—XXVI in FIG. 27 corresponds to the cross section view of FIG. 26. As shown in FIG. 27, the shape of the aperture part 31 is rectangular and the aperture part 31 has the minimum width D2.

Figure 28:
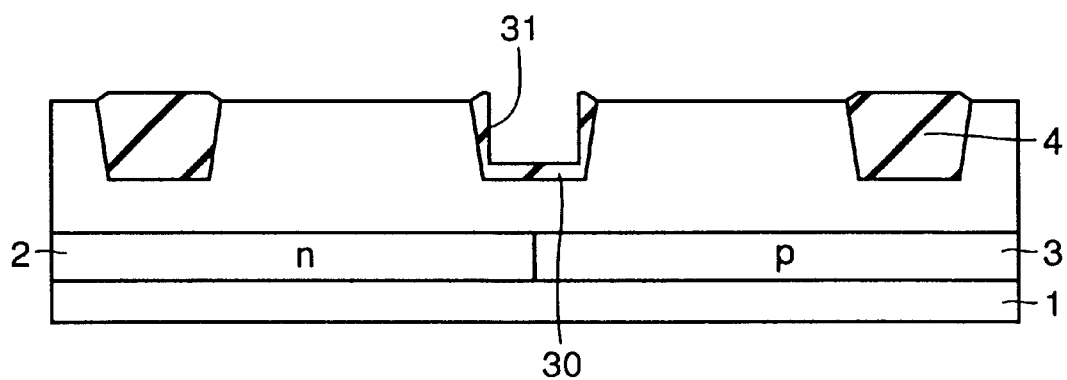
FIGS. 28 to 30 are cross section views showing the second to fourth steps of the process for the semiconductor device as shown in FIG. 25.

Next, a silicon oxide film of the thickness of approximately 100 nm is formed through a CVD method. Thereby, a bottom part insulating film, which covers the exposed bottom surface of the central trench, can be formed so that a base insulating film 30 can be formed as shown in FIG. 28. At this time, in the case that the minimum width of the aperture of the central trench is assumed to be 300 nm, the minimum width D2 of the aperture part 31 after the formation of the base insulating film 30 becomes approximately 100 nm.

Next, the silicon oxide film 19 is flattened in the same manner as in the first embodiment and the silicon nitride film 16, the polysilicon film 15 and the silicon oxide film 14 are removed and, then, an n well 2 and a p well 3 are formed. Thereby, a structure shown in FIG. 28 can be gained.

Next, a gate insulating film 5 of the thickness of approximately 8 nm is formed through a thermal oxidation method, or the like, and on top of this, a polysilicon film 6 of the thickness of approximately 80 nm is formed through a CVD method. At this time, the minimum width D2 of the aperture part 31 is approximately 100 nm, which is two times, or less, as large as the thickness of the polysilicon film 6.

Figure 29:
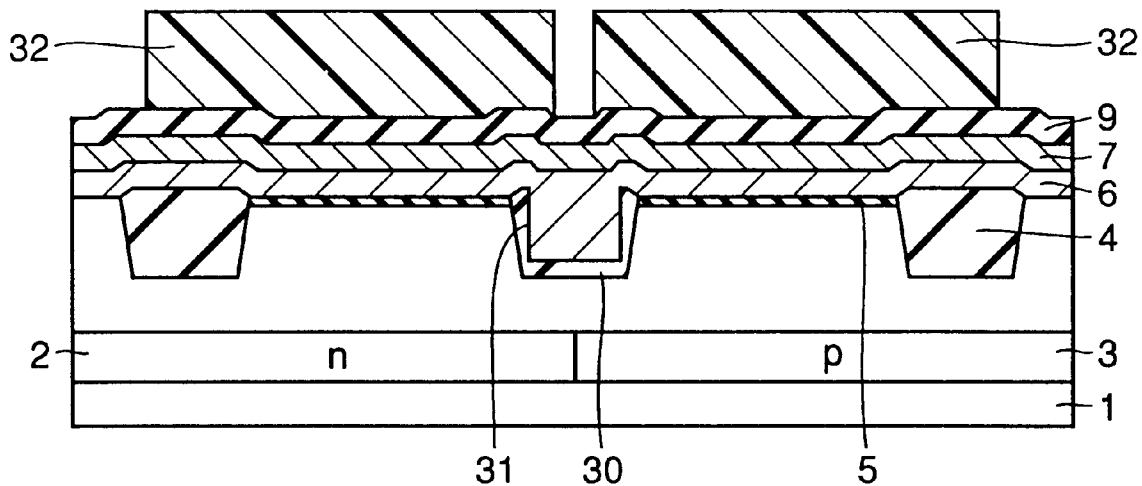

Thereby, the aperture part 31 can be filled in with the polysilicon film 6 as shown in FIG. 29 and the thickness of the polysilicon film 6 located within the central trench can be made larger than the thickness of the polysilicon film 6 which extends on the main surface of the silicon substrate 1. In addition, the unevenness of the top surface of the polysilicon film 6 which has been filled in into the aperture 31 can be reduced.

Next, a tungsten silicide film 7 and an insulating film 9 are formed on the polysilicon film 6 in the same manner as in the first embodiment and a photoresist 32 is applied to the insulating film 9 so that the photoresist 32 is patterned into a predetermined shape through a photomechanical process as shown in FIG. 29.

At this time, an aperture is created in the part located above the central trench so as to expose part of the surface of the insulating film 9 which is located above this trench. In this condition, the insulating film 9 is etched by using the photoresist 32 as a mask so as to pattern the insulating film 9.

Next, the photoresist 32 is removed and the tungsten silicide film 7 and the polysilicon film 6 are etched by using the insulating film 9 as a mask. Thereby, gate electrodes 8 are formed as shown in FIG. 30.

At this time, the above described etching can be stopped at the insulating film of the lower layer in the parts other than the part above the central trench. Above the central trench, however, since the thickness of the polysilicon film 6 is thicker than that of the other parts as shown in FIG. 29, the etching can be stopped within the polysilicon film 6.

Figure 30:
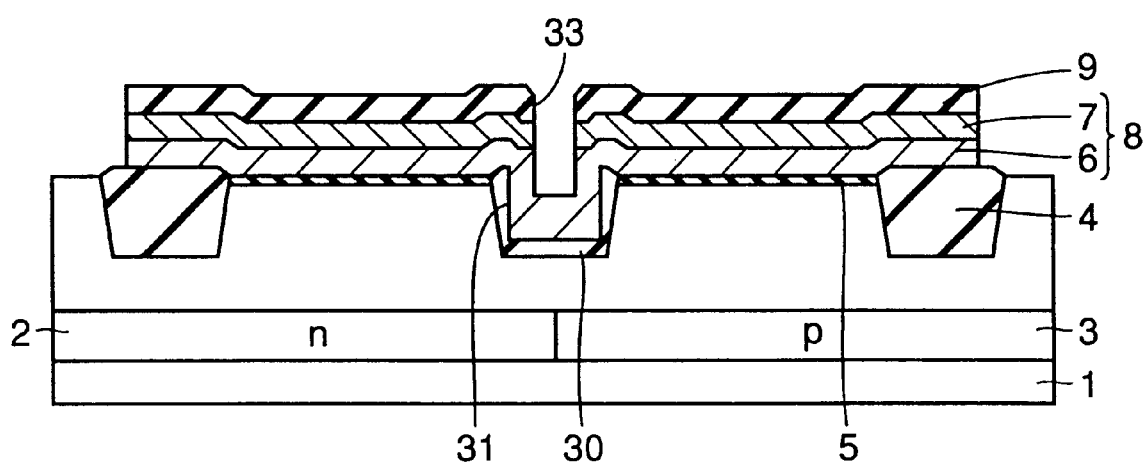

Thereby, as shown in FIG. 30, a recess 33 can be formed above the central trench penetrating through the tungsten silicide film 7 so that while the tungsten silicide film 7 is divided above the polysilicon film 6 within the central trench, a connection part which connects the pMOS transistor Q1 and the nMOS transistor Q2 can be made to remain below the recess 33.

In addition, since the shape of the photoresist (mask film) 32 for patterning the gate electrodes 8 may only be devised, it is not necessary to add a new mask film.

Figure 31:
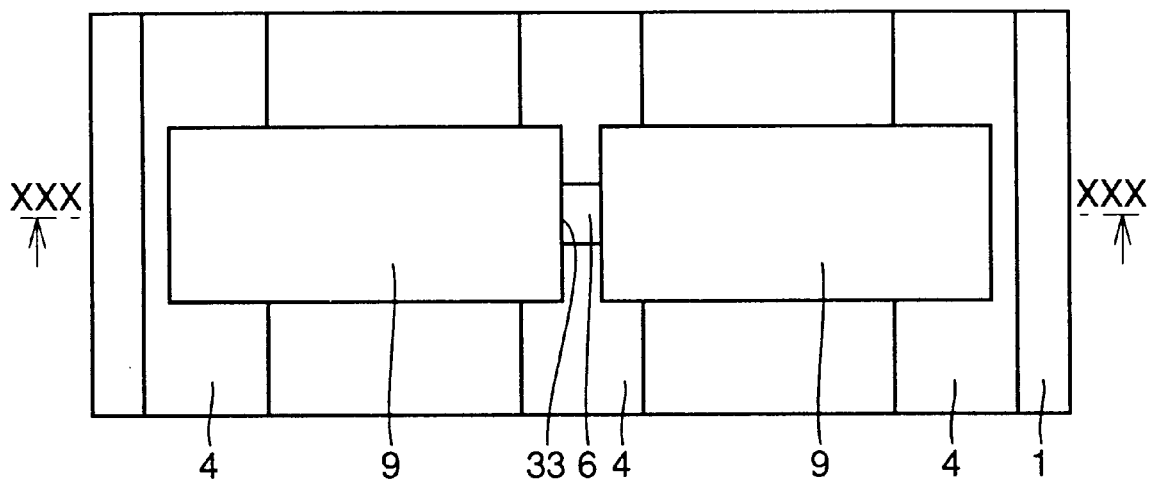
FIG. 31 is a plan view of the semiconductor device as shown in FIG. 30.
Figure 32:
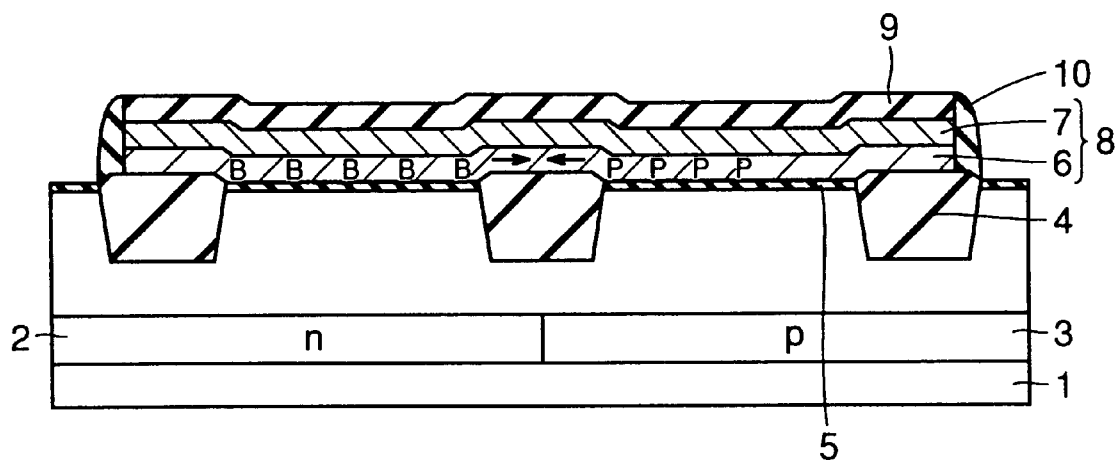
FIG. 32 is a cross section view showing an example of the structure of a semiconductor device according to a prior art.

Here, FIG. 31 shows a plan view of a device in the present step. The cross section view along line XXX—XXX of FIG. 31 is shown in FIG. 30.

Hereafter the same steps as in the first embodiment follow so as to form the sidewall insulating film 10, the interlayer insulating film 11, the contact hole 12 and the wiring layer 13, resulting in the dual gate type CMOS device shown in FIG. 25.

As described above, in accordance with a semiconductor device according to the present invention, the first and the second parts, which become parts of the gate electrodes of MOS transistors of different conductive types, can be connected within a trench and, therefore, the gate electrodes of the MOS transistors of different conductive types can be formed of one continuous conductive layer. Thereby, it becomes unnecessary to increase contact holes or wires and an increase in the element area can be avoided. As a result, the reduction of the integrity can be avoided.

In addition, impurities can be prevented from mutually diffusing when passing through the metal-based conductive film and, therefore, the fluctuation of the threshold voltage Vth and the formation of a region which is not the surface channel can be prevented.

Accordingly, mutual diffusion of the impurities of different conductive types can be prevented in the gate electrodes, which have regions to which these impurities are introduced, without reducing the integrity.

In accordance with a process for a semiconductor device according to one aspect of the present invention, the metal-based conductive film can be divided above the trench isolation region and, therefore, mutual diffusion of the impurities of different conductive types can be prevented in the gate electrodes.

In addition, only the shape of the first and the second mask films for forming the first and the second sidewall insulating films for forming the source and drain of a MOS transistor can be devised and, therefore, the addition of a new mask is not necessary. Furthermore, since the gate electrodes can be formed of one continuous conductive layer, an increase in the element area can be avoided.

In accordance with a process for a semiconductor device according to another aspect of the present invention, the metal-based conductive film can be divided above the silicon film within the trench so that mutual diffusion of the impurities of different conductive types can be prevented in the gate electrodes.

In addition, since only the shape of the mask film for patterning the gate electrodes can be devised, the addition of a new mask is not necessary. Furthermore, since the first and the second parts can be connected through a silicon film which has remained within the trench, the gate electrodes can be formed of one continuous conductive layer so that an increase in the element area can be avoided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate having a trench at the main surface; and
   a gate electrode which is formed on said main surface with a gate insulating film interposed and which includes silicon film and a metal-based conductive film,
   wherein said silicon film has a first part into which impurities of a first conductive type are doped, a second part into which impurities of a second conductive type are doped and a connection part which is formed of said silicon film and connects said first part and said second part within said trench and extends along said trench;
   a recess extending into said trench reaching said connection part, penetrating through said metal-based conductive film; and
   an insulating film is filled in into said recess.

2. The semiconductor device according to claim 1, wherein:
   said trench is formed in an element isolation region;
   said connection part is formed above said trench with a underlying insulating film interposed; and
   the thickness of said underlying insulating film is larger than the thickness of said gate insulating film.

3. The semiconductor device according to claim 2, wherein the minimum width of an opening defined by said underlying insulating film in said trench is two times, or less, as large as the thickness of said silicon film.

* * * * *